United States Patent
Weng et al.

(10) Patent No.: US 7,189,640 B2
(45) Date of Patent: Mar. 13, 2007

(54) METHOD OF FORMING DAMASCENE STRUCTURES

(75) Inventors: Chun-Jen Weng, Tai-Nan (TW); Yu-Shiang Lin, Taipei Hsien (TW); Chih-Yi Cheng, Chang-Hua (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/904,877

(22) Filed: Dec. 2, 2004

(65) Prior Publication Data

US 2006/0121730 A1  Jun. 8, 2006

(51) Int. Cl.
 *H01L 21/4763* (2006.01)
(52) U.S. Cl. ........................ 438/636; 438/638; 430/317
(58) Field of Classification Search ................ 438/618, 438/620, 622, 623, 624, 631, 636, 638; 430/314, 430/315, 316, 317
See application file for complete search history.

(56) References Cited

U.S. PATENT DOCUMENTS

| 6,277,750 | B1 * | 8/2001 | Pawlowski et al. ......... 438/689 |
| 6,653,411 | B2 * | 11/2003 | Puligadda et al. .......... 525/400 |
| 6,664,177 | B1 * | 12/2003 | Lin et al. .................... 438/624 |
| 6,762,012 | B2 * | 7/2004 | Kim et al. ................... 430/320 |
| 2001/0056144 | A1 * | 12/2001 | Lamb et al. ................. 524/377 |
| 2003/0085408 | A1 * | 5/2003 | Yang et al. .................... 257/77 |
| 2004/0142554 | A1 * | 7/2004 | Lui et al. ..................... 438/631 |
| 2005/0118749 | A1 * | 6/2005 | Sakamoto et al. .......... 438/107 |

* cited by examiner

*Primary Examiner*—M. Wilczewski
*Assistant Examiner*—Seth Barnes
(74) *Attorney, Agent, or Firm*—Winston Hsu

(57) ABSTRACT

A method of forming damascene structures. A substrate including a dielectric layer thereon is provided. The dielectric layer has a plurality of via holes. A gap filler is formed into each via hole. Subsequently, a first anti-reflective coating (ARC) film and a second ARC film are consecutively formed on the dielectric layer. A photoresist pattern for defining a trench pattern is formed on the second ARC film. Following that, an etching process is performed to remove an upper part of the dielectric layer left uncovered by the photoresist pattern to form a plurality of trenches.

10 Claims, 10 Drawing Sheets

METHOD OF FORMING DAMASCENE STRUCTURES

BACKGROUND OF INVENTION

1. Field of the Invention

The present invention relates to a method of forming damascene structures, and more particularly, to a method of forming damascene structures using two anti-reflective coating (ARC) films.

2. Description of the Prior Art

Damascene structure refers to the practice of forming inter-connecting wires first developed by the ancient artisans of Damascus. Damascene structure, including single damascene structure and dual damascene structure, is essential nowadays in the fabrication of inter-connecting wires in semiconductor devices, especially in the fabrication of copper inter-connecting wires. For implementing a single damascene structure, a photoresist pattern is first formed onto a dielectric layer positioned on a substrate to define the positions of the via holes to be etched. Subsequently, an etching process is performed to etch the dielectric layer not covered by the photoresist pattern so as to form a plurality via holes. Finally, the photoresist pattern is stripped, a metal layer is then deposited to fill up the via holes, and a polishing process is performed to form a plurality of inter-connecting wires. As device integration improves day by day, the pattern of the via holes becomes denser and each via hole has an increasingly high aspect ratio. Accordingly, the photoresist pattern used to define the via holes becomes more sophisticated, and therefore has a poor adhesion to the dielectric layer. This makes the photoresist pattern collapse easily during the etching process.

Please refer to FIG. 1 and FIG. 2, which are schematic diagrams illustrating a conventional method of forming a single damascene structure. As shown in FIG. 1, a substrate 10 having a dielectric layer 12 thereon is provided. An anti-reflective (ARC) film 14 is then formed over the dielectric layer 12. Subsequently, a photoresist layer (not shown) is then coated onto the ARC film 14, and an exposure-and-development process is performed to form a photoresist pattern 16 to define the pattern of via holes to be etched later. The ARC film 14 is disposed between the photoresist layer (not shown) and the dielectric layer 12 for the following reason. Over the course of the exposure, the ARC film 14 is able to absorb light beams incident toward the dielectric layer 12 and reduce reflected light beams so that the photoresist pattern 16 developed later is sharp.

As shown in FIG. 2, an etching process is then performed using the photoresist pattern 16 as a mask to etch the region of the dielectric layer 12 unprotected by the photoresist pattern 16 so as to form a plurality of via holes 18. As mentioned earlier, as the pattern of the via holes 18 becomes denser, the photoresist pattern 16 can easily collapse during the etching process as shown in the right portion of FIG. 2, especially on the edge of the substrate 10. Therefore, the prior art suffers from collapse of the photoresist pattern 16, which makes it difficult to form the via holes 18 correctly.

SUMMARY OF INVENTION

It is therefore a primary object of the claimed invention to provide a method of forming dual damascene structures to overcome the aforementioned problems.

According to the claimed invention, a method of forming dual damascene structures is disclosed. The method includes the steps of:

providing a substrate comprising a dielectric layer thereon, the dielectric layer comprising a plurality of via holes;

forming a gap filler into each via hole;

forming a first anti-reflective coating (ARC) film on the dielectric layer;

forming a second ARC film on the first ARC film;

forming a photoresist pattern on the second ARC film to define a plurality of trenches; and performing an etching process to remove the first ARC film, the second ARC film, and an upper part of the dielectric layer not covered by the photoresist pattern to form the trenches.

It is appreciated that the method of the present invention is not limited to form dual damascene structures, and can be applied to form single damascene structures as well.

According to the method of the present invention, two ARC films are consecutively formed on the dielectric layer prior to forming the photoresist layer. These two ARC films not only play the role of reducing reflection of light beams in the exposure process, but also enhance the adhesion of the photoresist layer during the etching process. Consequently, the trenches formed by etching are accurately formed as desired since the photoresist pattern is tightly bonded to the ARC film during the etching process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
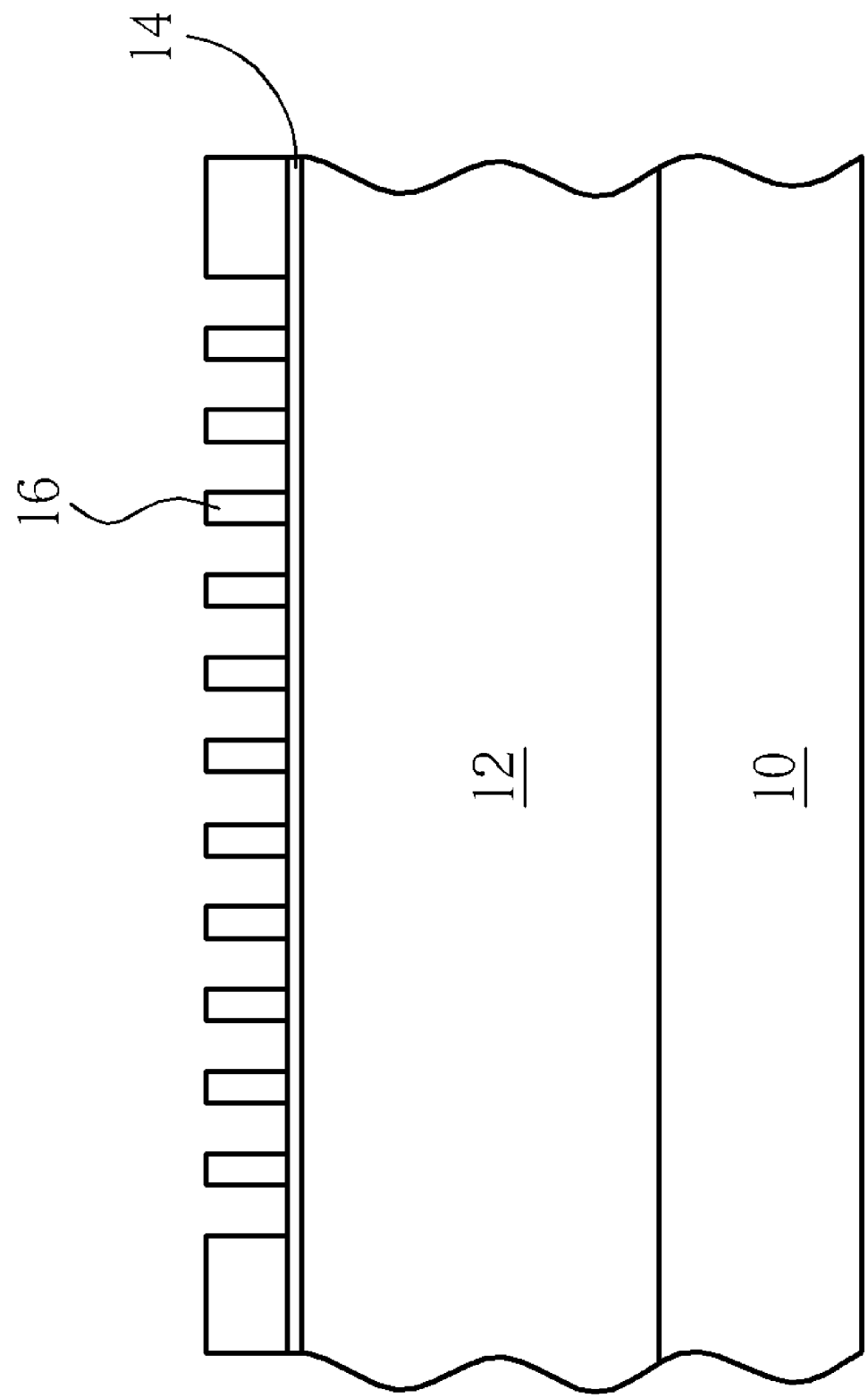
FIG. 1 and FIG. 2 are schematic diagrams illustrating a conventional method of forming single damascene structures.
Figure 2:
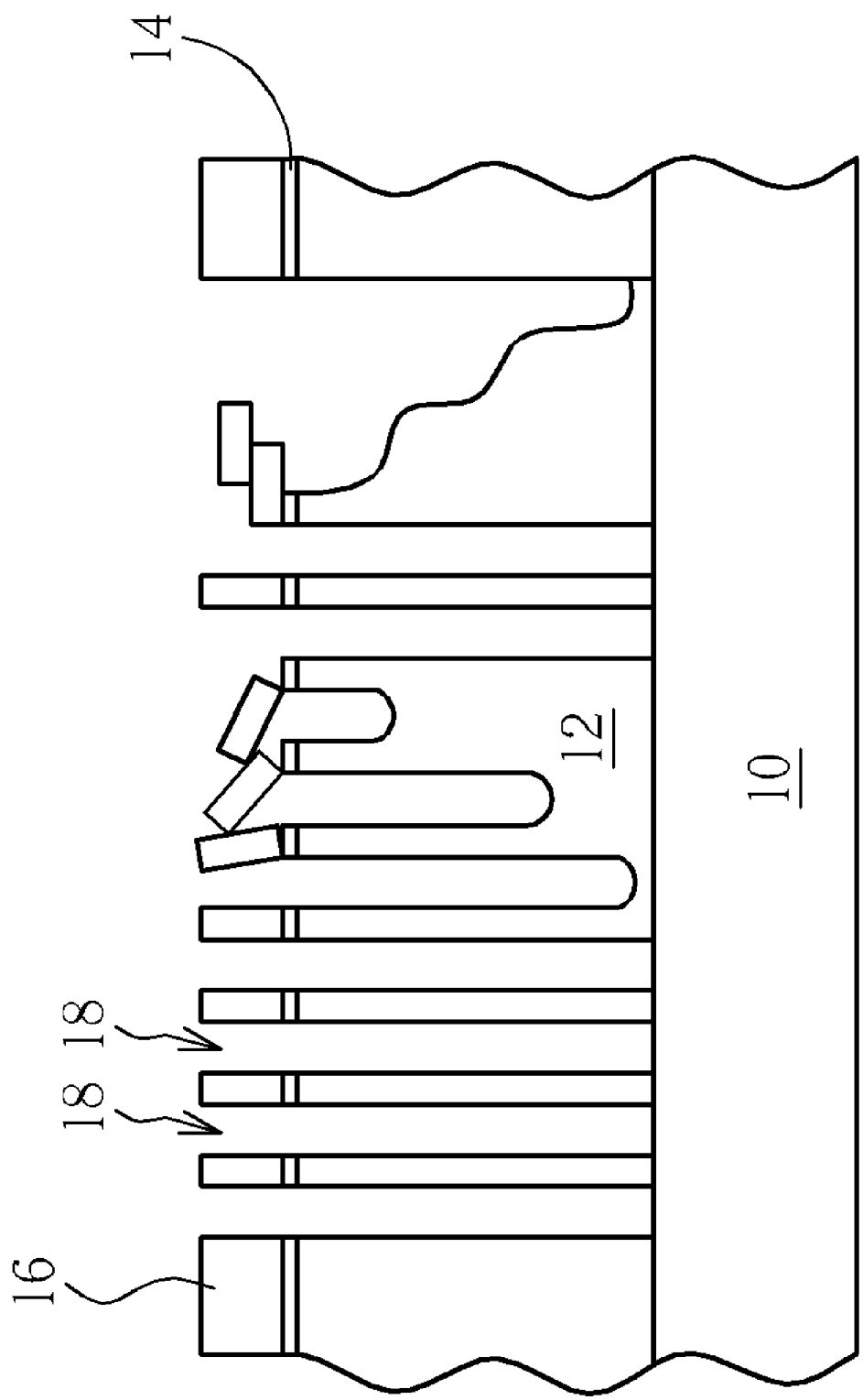
Figure 3:
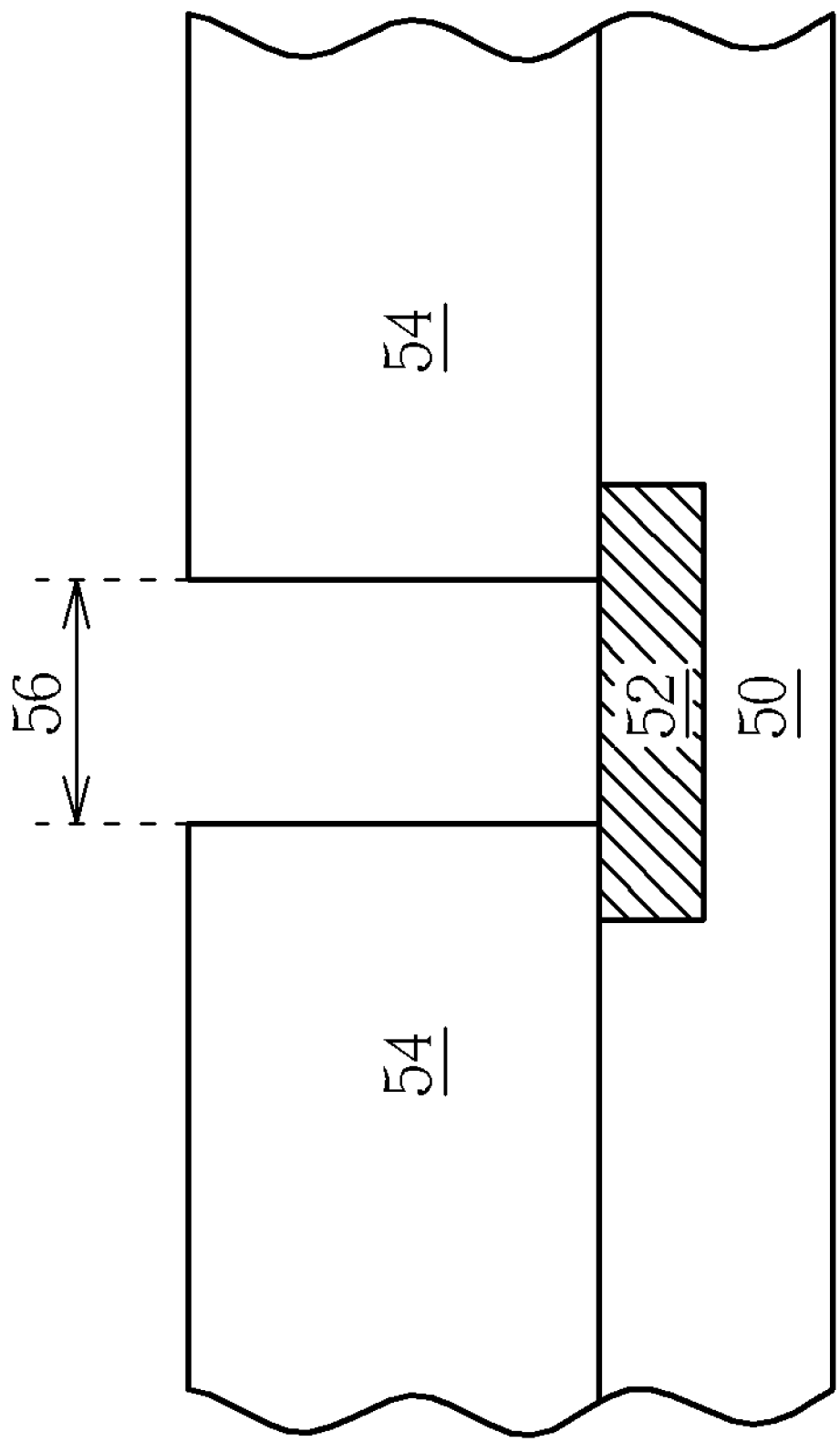
FIG. 3 through FIG. 10 are schematic diagrams illustrating a method of forming dual damascene structures according to a preferred embodiment of the present invention.

Please refer to FIG. 3 through FIG. 10. FIG. 3 through FIG. 10 are schematic diagrams illustrating a method of forming dual damascene structures according to a preferred embodiment of the present invention. For clarity of illustration, only a dual damascene structure is drawn in the figures. As shown in FIG. 3, a substrate 50 is provided. The substrate 50 includes a metal conducting wire 52 therein, and a dielectric layer 54 disposed on the substrate 50 and the metal conducting wire 52. The dielectric layer 54 has a via hole 56 corresponding to the metal conducting wire 52. In this embodiment, the dielectric layer 54 is a single dielectric layer. However, for other considerations, the dielectric layer 54 can also be a composite dielectric layer with or without an etching stop layer.

Figure 4:
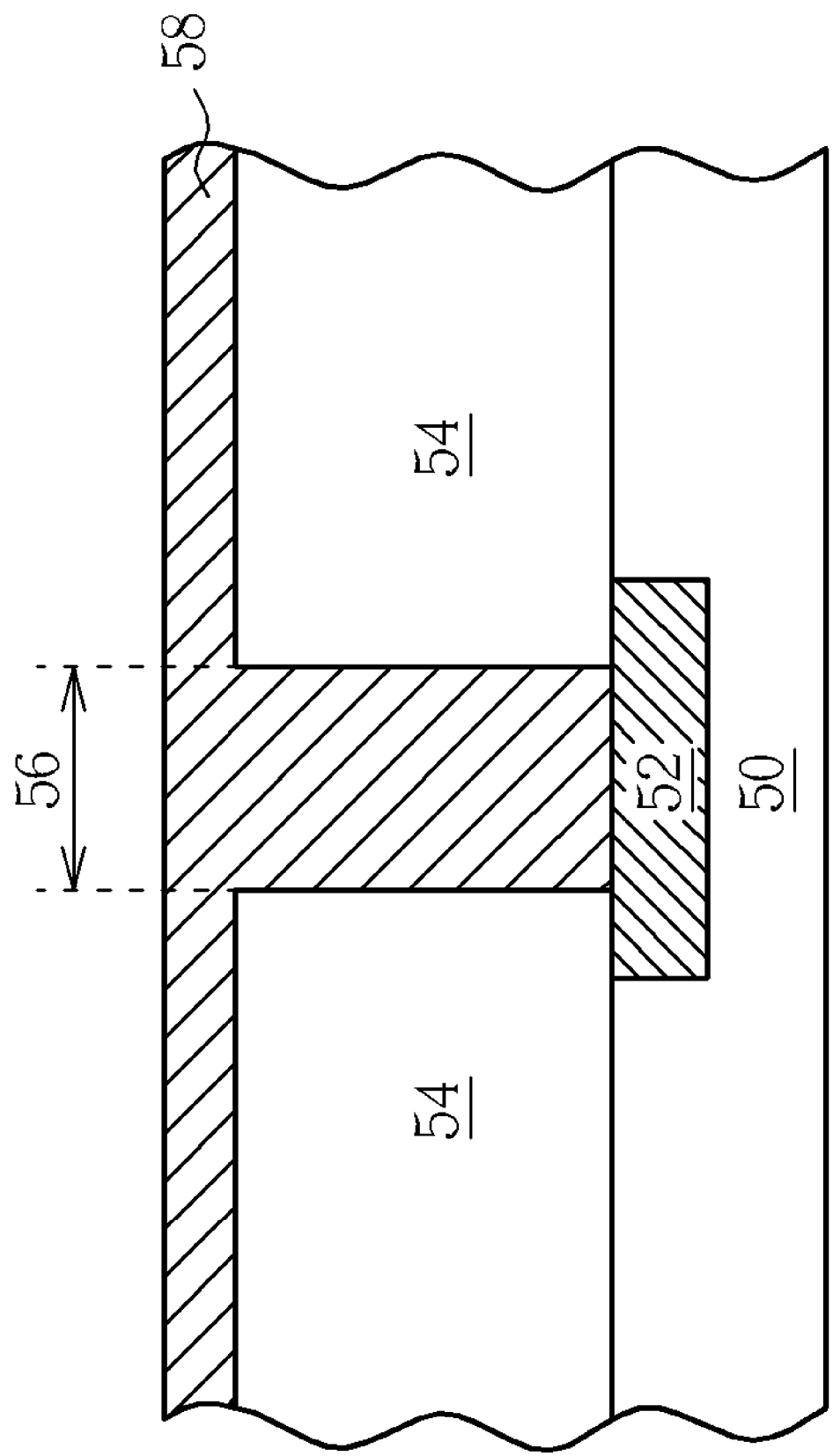
Figure 5:
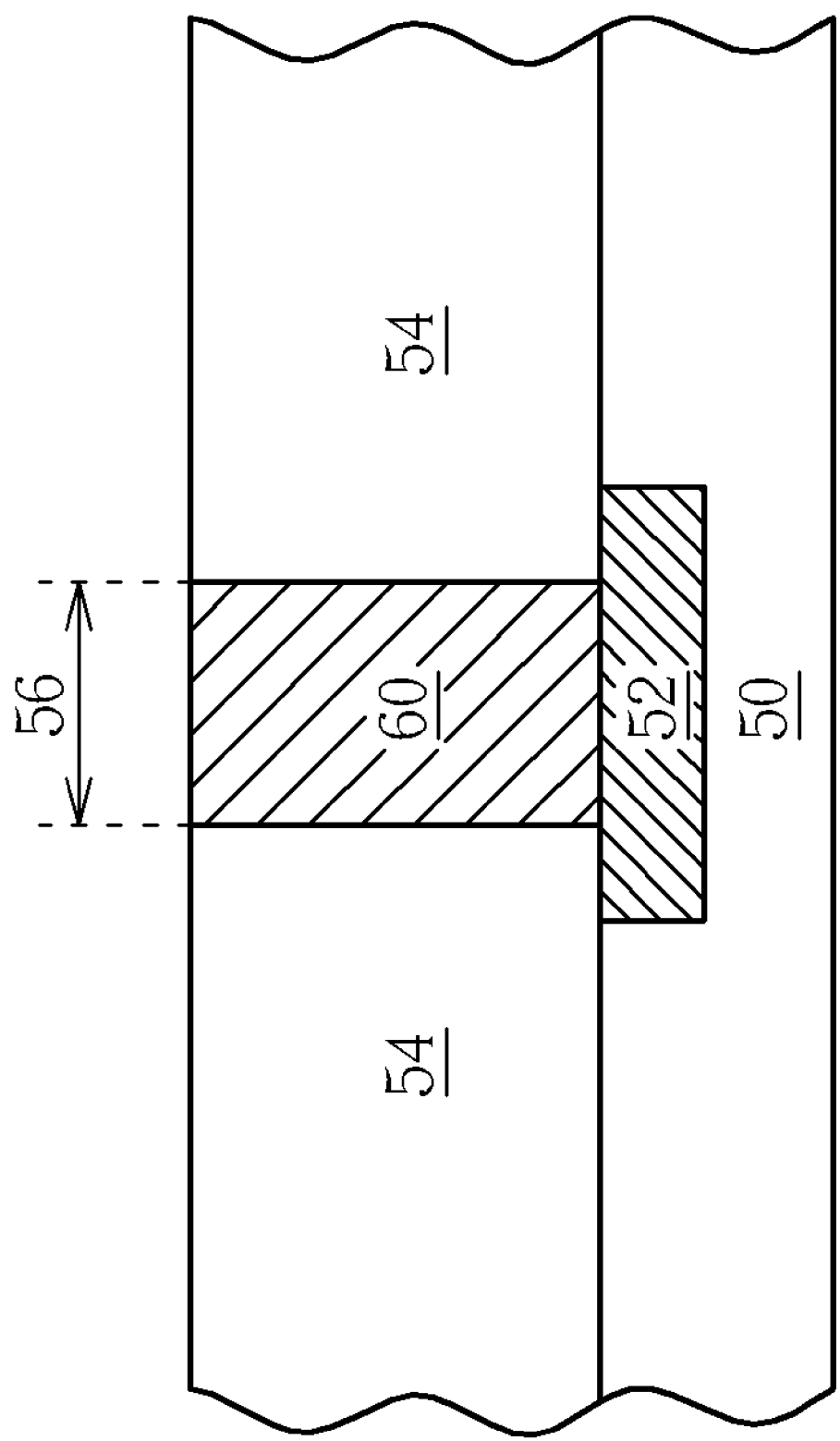

As shown in FIG. 4, a gap fill process (referred to as GFP) is performed by firstly coating a photoresist layer 58 to cover the substrate 50 and to fill the via hole 56. As shown in FIG. 5, a planarization process, such as a polishing process, an etching process, or an exposure and development process, is performed to remove the photoresist layer 58 positioned over the top surface of the dielectric layer 54, so as to form a gap filler 60 inside the via hole 56. The gap filler 60 here is used to prevent the edge of the via hole 56 from being over-etched in the following etching process.

Figure 6:
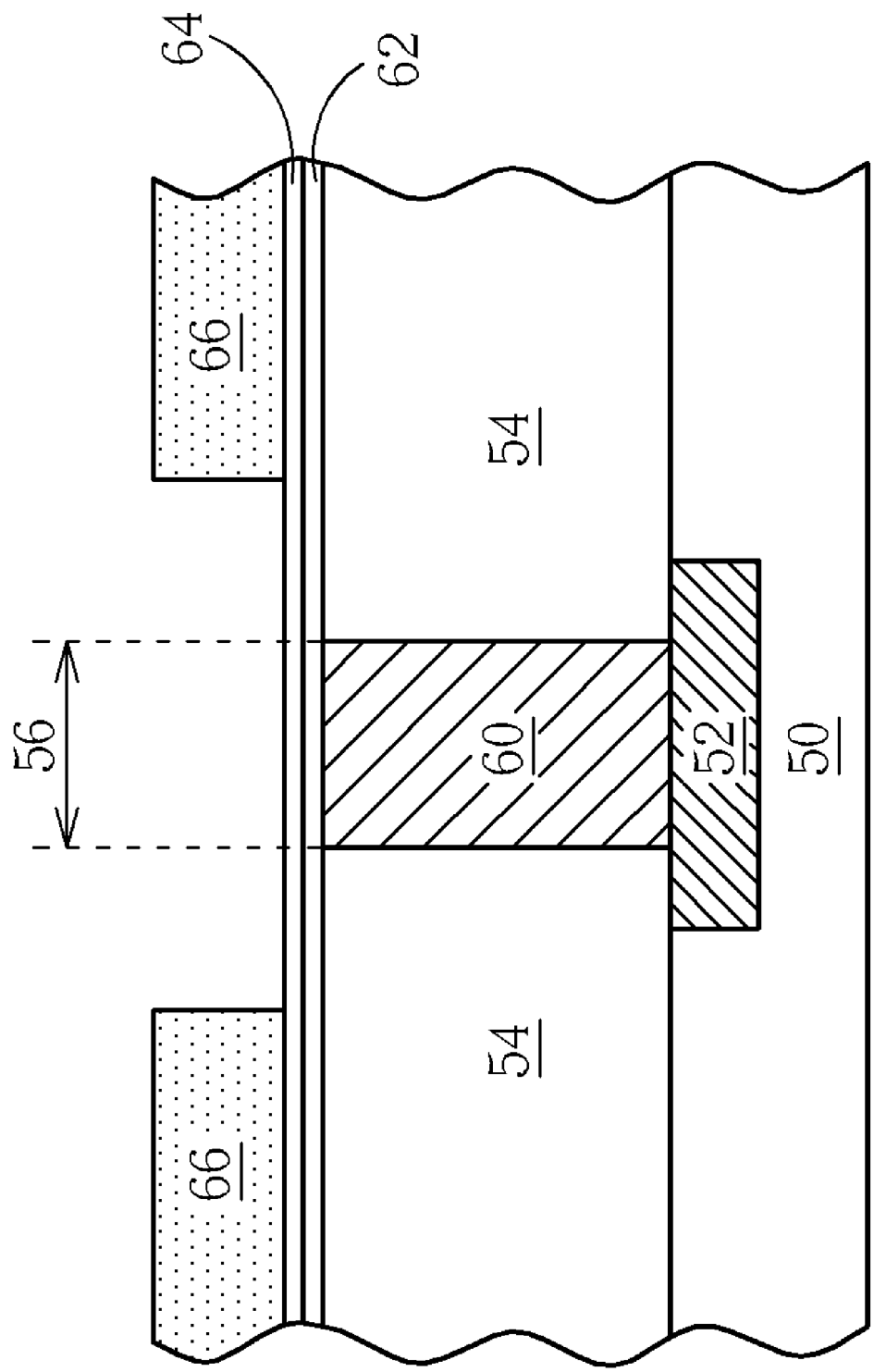

As shown in FIG. 6, a first anti-reflective coating (ARC) film 62 and a second ARC film 64 are consecutively formed over the substrate 50 and the gap filler 60. Subsequently, a photoresist layer (not shown) is coated on the second ARC film 64, and an exposure and development process is performed to form a photoresist pattern 66. The photoresist pattern 66 is used to define the pattern of a trench. In this embodiment, both of the first ARC film 62 and the second ARC film 64 are materials substantially including 1-methoxy-2-propanol (propylene glycol monomethyl ether), 2-(1-methoxy)propyl acetate (propylene glycol monomethyl ether acetate), crosslinking agents, and methacrylate solids. However, these materials are not limiting.

In the prior art, the ARC film originally works to reduce reflective light beams during the exposure process so that light exposure toward the photoresist layer is well controlled. Accordingly, the photoresist pattern developed later will have a better and sharp shape as desired. It is worth noting that the top surface of the dielectric layer 54 and the photoresist filler 60 is not very smooth after the planarization process, therefore only one single ARC film formed on the dielectric layer 54 normally fails to provide a smooth surface. Thus, the first ARC film 62 and the second ARC film 64 are consecutively formed on the dielectric layer 54. In such a case, the smoothness of the second ARC film 64 is guaranteed. This enhances the adhesion ability of the photoresist layer to be coated later. Therefore, with these two consecutively-formed first ARC film 62 and second ARC film 64, the adhesion of the photoresist layer is improved so that the photoresist pattern formed later does not easily collapse during the etching process.

Figure 7:
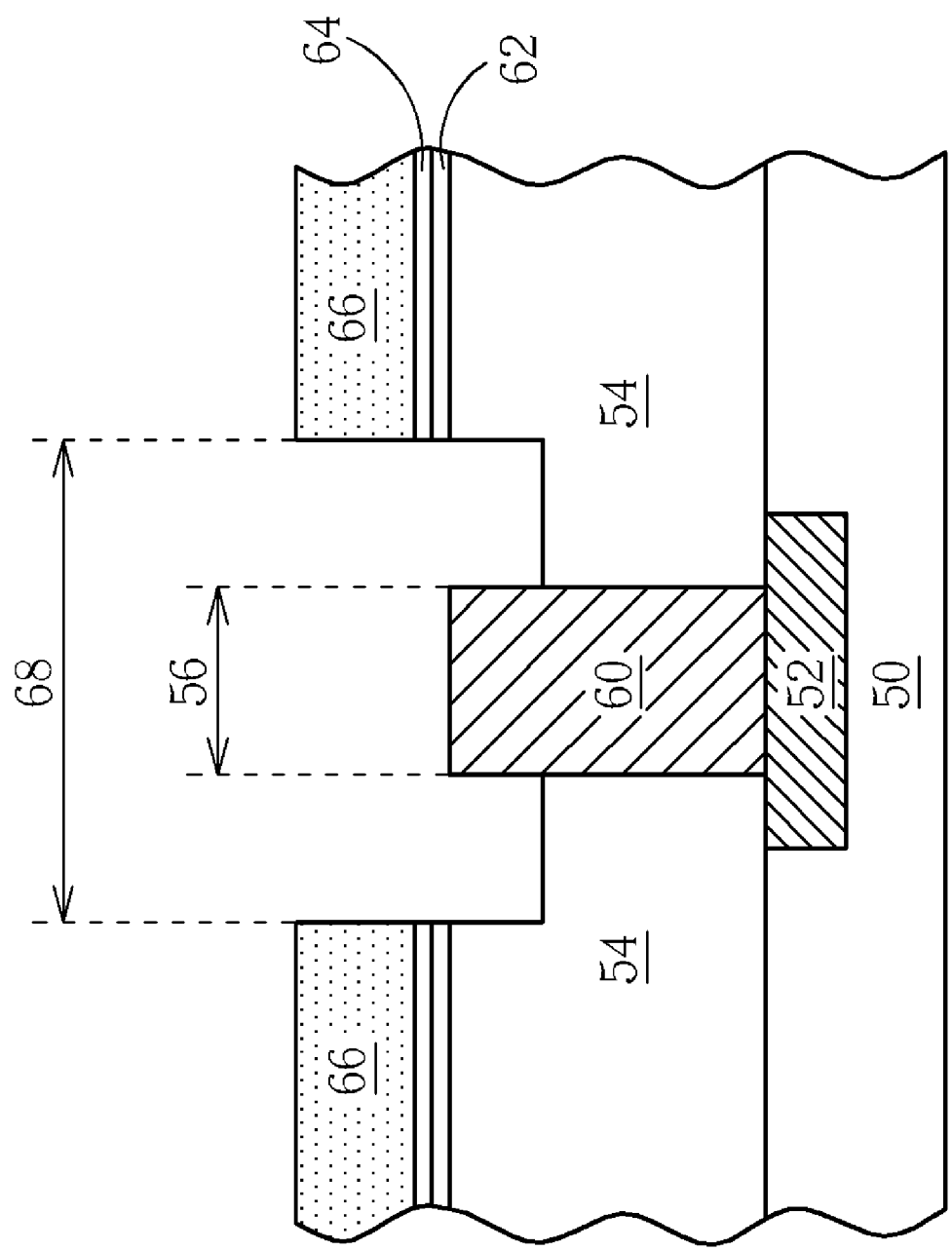
Figure 8:
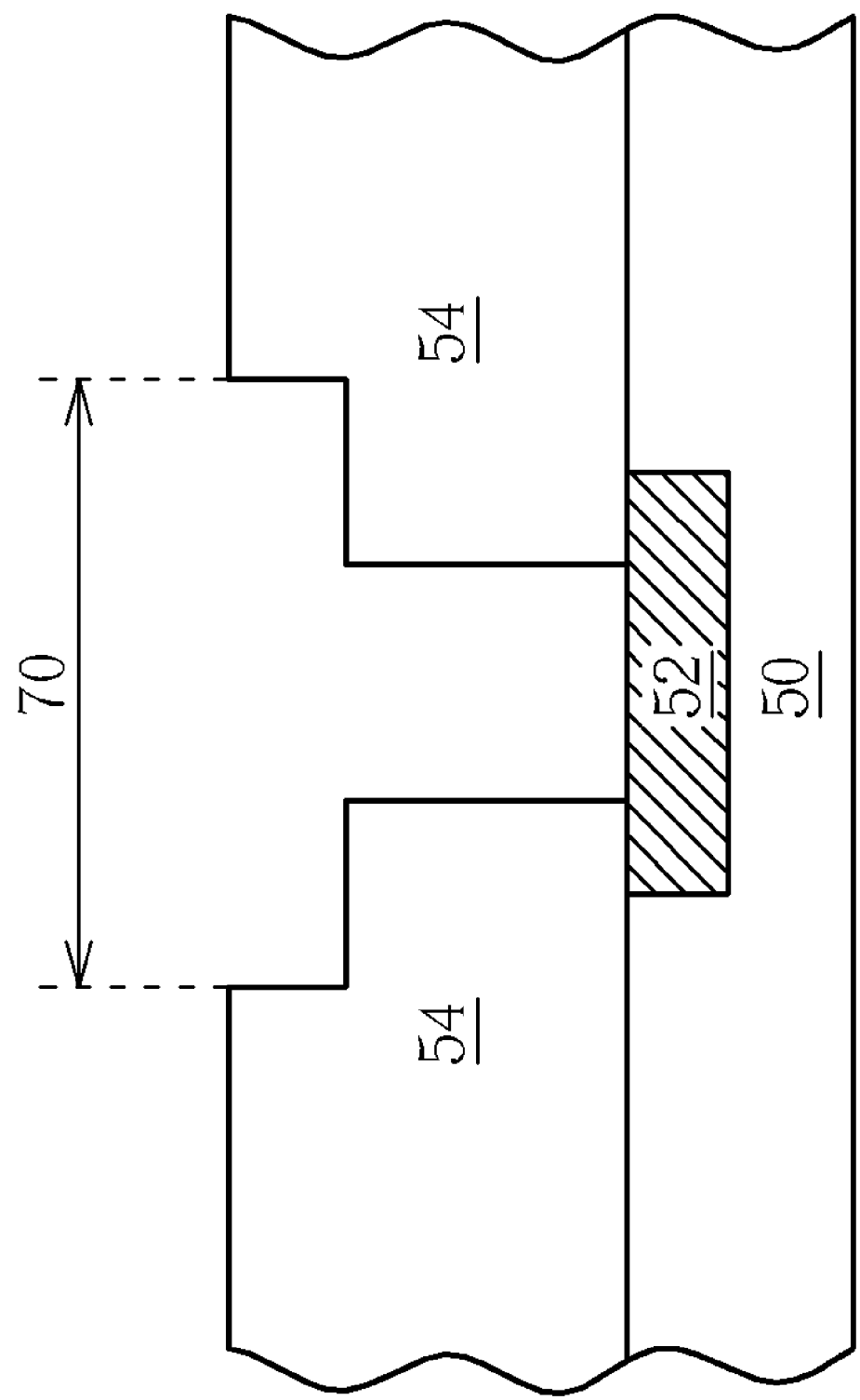

As shown in FIG. 7, an etching process is then performed to remove the first ARC film 62, the second ARC film 64, and the upper part of the dielectric layer 54 left uncovered by the photoresist pattern 66 to form a trench 68. As shown in FIG. 8, the photoresist pattern 66 and the gap filler 60 are then stripped to form a dual damascene structure 70. The dual damascene structure 70 so far is accomplished. The steps for forming an inter-connecting wire are described hereafter. It is appreciated that the first ARC film 62 and the second ARC film 64 may not be necessarily removed if possible so as to improve the adhesion of the thin film to be formed.

Figure 9:
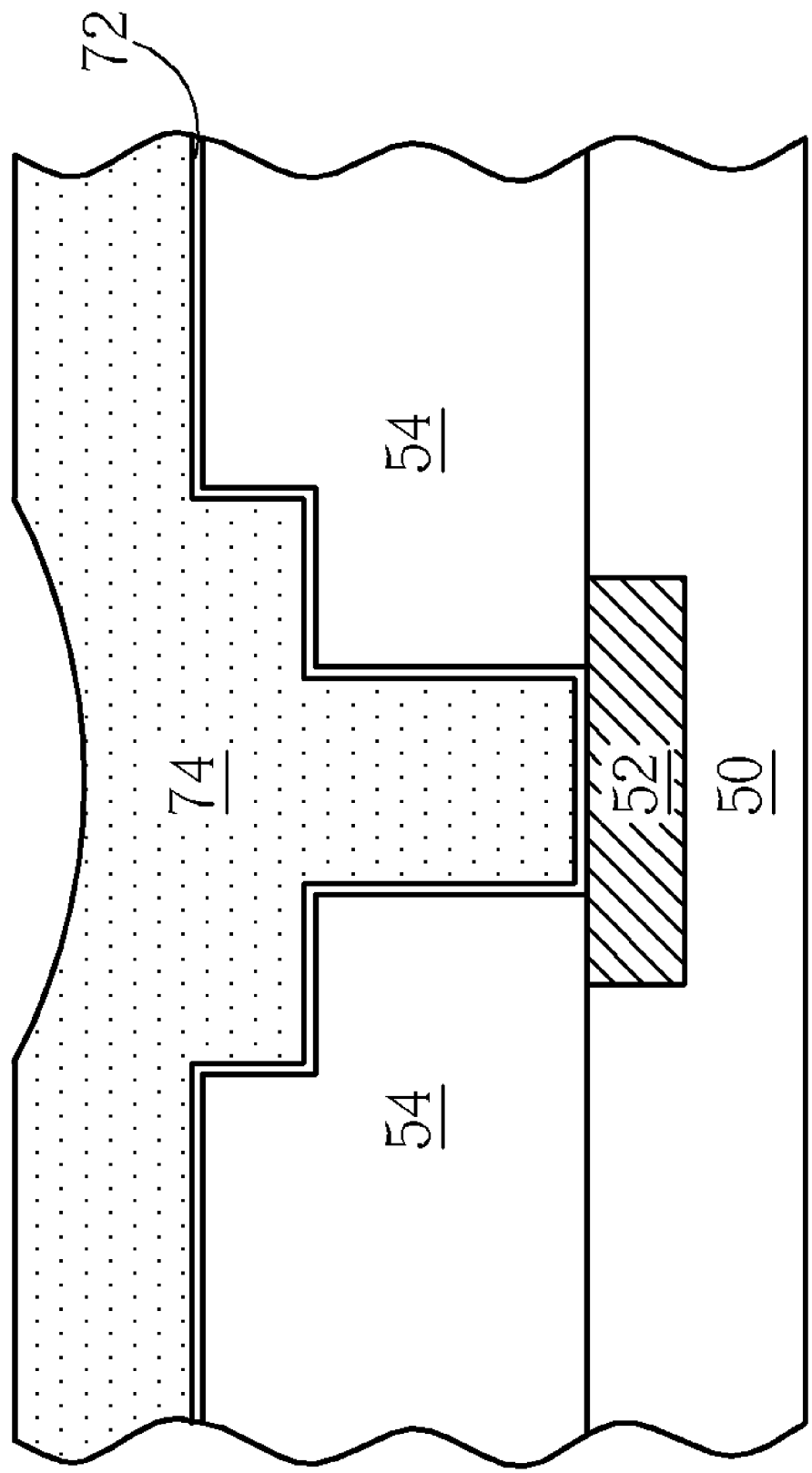
Figure 10:
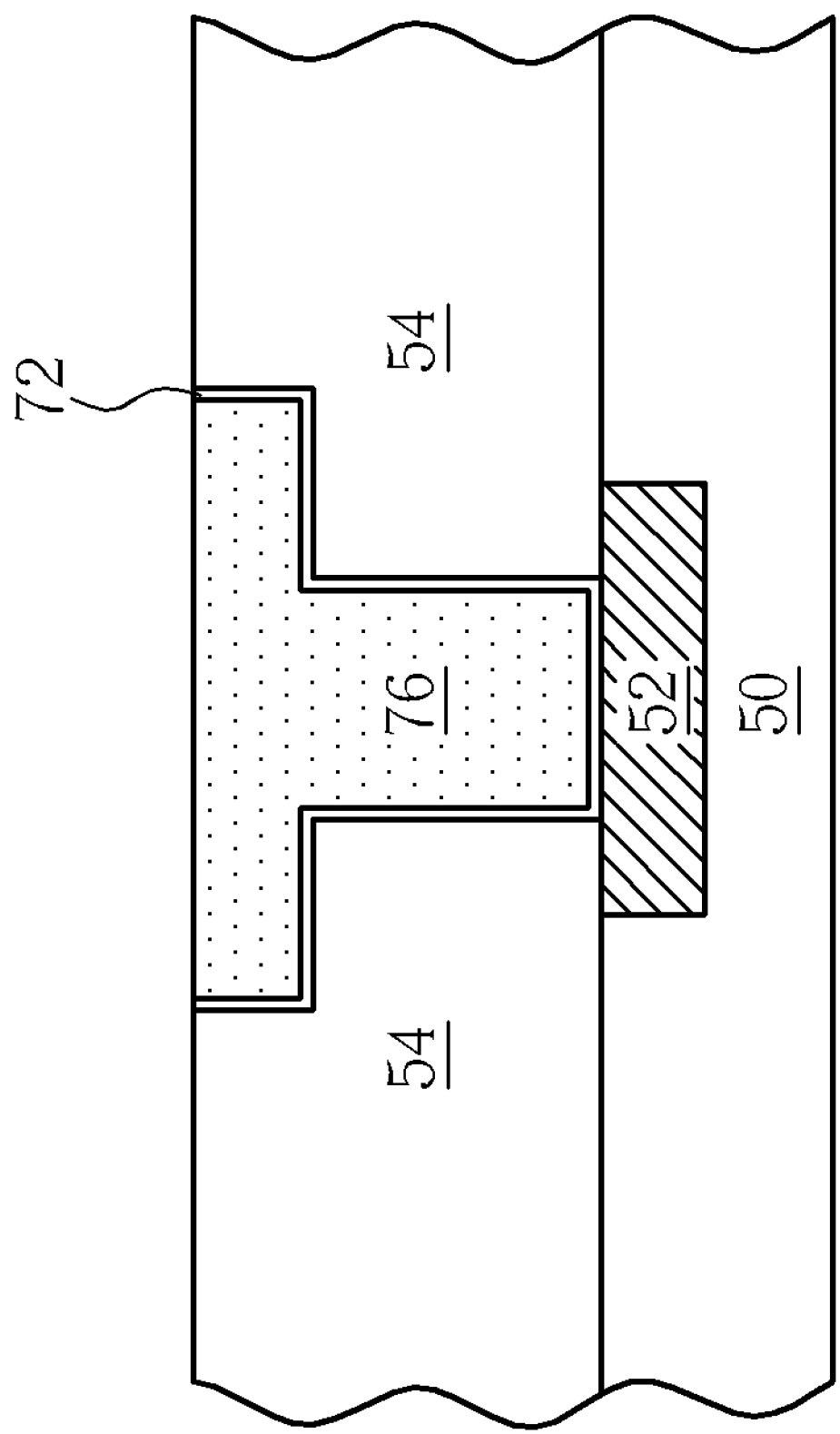

As shown in FIG. 9, a liner barrier layer 72 is formed on the surface of the dielectric layer 54. Then, a metal layer (normally a copper layer) 74 is formed on the surface of the liner barrier layer 72. The liner barrier 72 is disposed between the dielectric layer 54 and the metal layer 74 for preventing diffusion of metal ions, especially copper ions. As shown in FIG. 10, a polishing process is performed to form an inter-connecting wire 76.

According to the present invention, the via hole is filled with a gap filler prior to forming the trench, therefore the edge of the via hole is not damaged during the etching process for forming the trench. In addition, two ARC films are consecutively formed over the dielectric layer for not only absorbing light beams in the exposure process, but particularly for increasing the adhesion of the photoresist pattern. Accordingly, the photoresist pattern is tightly fastened during the etching process, and thus the trench is perfectly formed as desired. It is appreciated that the method of the present invention is not limited to form dual damascene structures, and can be applied to form single damascene structures.

In comparison with the prior art, the present invention utilizes two ARC films instead of a single ARC film prior to coating the photoresist layer. Consequently, the photoresist pattern is tightly fastened during the etching process even though the bottom area of the photoresist pattern is relatively small.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming dual damascene structures, comprising:
    providing a substrate comprising a dielectric layer thereon, the dielectric layer comprising a plurality of via holes;
    forming a gap filler into each via hole;
    forming a first anti-reflective coating (ARC) film on the dielectric layer subsequent to forming the gap filler into the via holes;
    forming a second ARC film on the first ARC film;
    forming a photoresist pattern on the second ARC film to define a plurality of trenches;
    performing an etching process to remove the first ARC film, the second ARC film, and an upper part of the dielectric layer not covered by the photoresist pattern to form the trenches;
    removing the photoresist pattern and the gap fillers after the trenches are formed; and
    removing the first ARC film and the second ARC film after the photoresist pattern and the gap fillers are removed.

2. The method of claim 1, wherein the substrate further comprises at least a conducting wire under the dielectric layer.

3. The method of claim 1, further comprising forming a plurality of dual damascene inter-connecting wires subsequent to removing the photoresist pattern and the gap fillers.

4. The method of claim 1, wherein the gap fillers comprise photoresist material.

5. The method of claim 1, wherein the step of forming the gap filler into each via hole comprises:
    forming a photoresist layer on the dielectric layer, the photoresist layer filling up the via holes and covering a top surface of the dielectric layer; and
    performing a planarization process to remove the photoresist layer positioned over the top surface of the dielectric layer.

6. The method of claim 5 wherein the planarization process comprises performing a polishing process.

7. The method of claim 5 wherein the planarization process comprises performing an etching process.

8. The method of claim 5 wherein the planarization process comprises performing an exposure and development process.

9. The method of claim 1, wherein the first ARC film comprises 1-methoxy-2-propanol (propylene glycol monomethyl ether), 2-(1-methoxy)propyl acetate (propylene glycol monomethyl ether acetate), crosslinking agents, and methacrylate solids.

10. The method of claim 1, wherein the second ARC film comprises 1-methoxy-2-propanol (propylene glycol monomethyl ether), 2-(1-methoxy)propyl acetate (propylene glycol monomethyl ether acetate), crosslinking agents, and methacrylate solids.

* * * * *